US009780789B2

(12) United States Patent
Atsatt et al.

(10) Patent No.: US 9,780,789 B2
(45) Date of Patent: Oct. 3, 2017

(54) APPARATUS FOR AUTOMATICALLY CONFIGURED INTERFACE AND ASSOCIATED METHODS

(71) Applicant: Altera Corporation, San Jose, CA (US)

(72) Inventors: Sean R. Atsatt, Santa Cruz, CA (US); Robert Landon Pelt, Austin, TX (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/170,418

(22) Filed: Jan. 31, 2014

(65) Prior Publication Data

US 2014/0145758 A1    May 29, 2014

Related U.S. Application Data

(63) Continuation-in-part of application No. 13/105,968, filed on May 12, 2011.

(60) Provisional application No. 61/334,562, filed on May 13, 2010.

(51) Int. Cl.
| | | |
|---|---|---|
| H03K 19/0175 | (2006.01) | |
| H03K 19/173 | (2006.01) | |
| H03K 19/177 | (2006.01) | |

(52) U.S. Cl.
CPC .  H03K 19/017581 (2013.01); H03K 19/1731 (2013.01); H03K 19/17792 (2013.01)

(58) Field of Classification Search
None
See application file for complete search history.

(56) References Cited

U.S. PATENT DOCUMENTS

| | | | | |
|---|---|---|---|---|
| 5,784,291 | A | * | 7/1998 | Chen ...................... G06F 15/78 712/32 |
| 5,812,472 | A | * | 9/1998 | Lawrence et al. ............ 365/201 |
| 5,912,852 | A | * | 6/1999 | Lawrence et al. ............ 365/201 |
| 6,034,542 | A | | 3/2000 | Ridgeway |
| 6,421,251 | B1 | | 7/2002 | Lin |
| 7,043,595 | B2 | | 5/2006 | Kawai |
| 7,444,454 | B2 | | 10/2008 | Yancey et al. |
| 7,493,511 | B1 | | 2/2009 | Yin et al. |
| 7,512,728 | B2 | | 3/2009 | Tseng |
| 7,724,028 | B1 | | 5/2010 | Ansari et al. |
| 7,724,032 | B2 | | 5/2010 | Hutton et al. |
| 7,737,725 | B1 | * | 6/2010 | Ansari ................ G06F 15/7867 326/41 |
| 7,844,761 | B1 | * | 11/2010 | Orthner ............... G06F 15/7867 710/10 |
| 7,912,997 | B1 | | 3/2011 | Murray |
| 7,913,022 | B1 | | 3/2011 | Baxter |
| 8,732,639 | B1 | * | 5/2014 | Fung ................... G06F 17/5031 716/106 |

(Continued)

OTHER PUBLICATIONS

U.S. Appl. No. 13/105,968, filed May 12, 2011, Atstatt et al.

(Continued)

*Primary Examiner* — Crystal L Hammond

(57) ABSTRACT

An integrated circuit (IC) includes a first circuit implemented using programmable circuitry of the IC, and a second circuit implemented using hardened circuitry of the IC. The IC further includes a configurable interface circuit to couple the first circuit to the second circuit using ready/valid signaling with a configurable ready-latency value.

20 Claims, 7 Drawing Sheets

(56) References Cited

U.S. PATENT DOCUMENTS

| | | | | |
|---|---|---|---|---|
| 2003/0101307 A1* | 5/2003 | Gemelli et al. | ............... | 710/305 |
| 2005/0257031 A1* | 11/2005 | Kundu | ................ | G06F 15/7867 712/226 |
| 2005/0259031 A1* | 11/2005 | Sanz | ...................... | H01Q 1/243 343/895 |
| 2010/0283505 A1* | 11/2010 | Koch | .................. | G06F 15/7867 326/41 |

OTHER PUBLICATIONS

U.S. Appl. No. 12/966,391, filed Dec. 13, 2010, Atstatt et al.
U.S. Appl. No. 13/105,976, filed May 12, 2011, Atstatt et al.
"Spartan-6 FPGA Memory Controller User Guide," UG388 (v2.3) Aug. 9, 2010, 66 pp.
"Avalon Interface Specifications," version 1.2, Apr. 2009, 66 pp.
Office communication of May 18, 2012 in U.S. Appl. No. 13/105,968, 9 pp.
Office communication of Feb. 14, 2013 in U.S. Appl. No. 13/105,968, 10 pp.
Office communication of Oct. 7, 2013 in U.S. Appl. No. 13/105,968, 12 pp.
Office communication of Mar. 26, 2014 in U.S. Appl. No. 13/105,968, 14 pp.
Office communication of Jan. 2, 2013 in U.S. Appl. No. 12/966,391, 8 pp.
Office communication of Feb. 1, 2013 in U.S. Appl. No. 12/966,391, 8 pp.
Office communication of Jun. 19, 2012 in U.S. Appl. No. 13/105,976, 9 pp.
Office communication of Mar. 12, 2013 in U.S. Appl. No. 13/105,976, 10 pp.
Office communication of Nov. 4, 2013 in U.S. Appl. No. 13/105,976, 10 pp.
Office communication in U.S. Appl. No. 13/105,968, Aug. 27, 2015, 15 pgs.

* cited by examiner

APPARATUS FOR AUTOMATICALLY CONFIGURED INTERFACE AND ASSOCIATED METHODS

TECHNICAL FIELD

The disclosure relates generally to interfaces in electronic circuitry and, more particularly, to apparatus for configurable interfaces, such as interfaces with configurable latency, in integrated circuits (ICs), such as field-programmable gate arrays (FPGAs), and associated methods.

BACKGROUND

FPGAs provide designers with flexibility in designing systems for information/data processing. By having the ability to program or configure the FPGA, designers can effectively change the system specifications or performance. Further, end users may configure or program the FPGA to suit their applications.

Typical FPGAs include programmable logic circuitry and interconnect in their fabric. To provide system designers or users with increased functionality or flexibility, some FPGAs also include hardened circuitry. Examples of hardened circuitry include memory controllers, memory, processors, etc. Interface circuitry couples the programmable logic circuitry to the hardened circuitry. To meet timing specifications of competing functions near a clock synchronous interface, pipelining near the interface or build-time configurable interfaces, such as ready/valid latency, has been used.

SUMMARY

The disclosed concepts may be used in a wide variety of embodiments in order to provide configurable interfaces in ICs, such as FPGAs, with configurable or automatically generated ready-latency. In one exemplary embodiment, an integrated circuit (IC) includes a first circuit implemented using programmable circuitry of the IC, and a second circuit implemented using hardened circuitry of the IC. The IC further includes a configurable interface circuit to couple the first circuit to the second circuit using ready/valid signaling with a configurable ready-latency value.

In another exemplary embodiment, an FPGA includes FPGA fabric and hardened circuitry integrated in the FPGA. The FPGA further includes an interface circuit that couples the FPGA fabric to the hardened circuitry. The interface circuit has a configurable ready-latency value.

In yet another exemplary embodiment, a method of configuring an FPGA to implement a user's circuit using resources in the FPGA includes configuring an interface circuit coupled to a first circuit implemented using FPGA fabric and to a second circuit implemented as hardened circuitry. The interface circuit is adapted to provide communication between the first and second circuits using a ready/valid signaling protocol with a configurable ready-latency value.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

According to various embodiments, such as exemplary embodiments described in this document, the disclosed concepts provide apparatus and associated circuitry for interfacing circuitry or subsystems within FPGAs. FPGAs according to exemplary embodiments include programmable circuitry, e.g., programmable logic and/or programmable interconnect, for example, in the FPGA fabric. One or more circuits (or blocks) may be implemented using the FPGA fabric (FPGA fabric resources, such as programmable logic, programmable interconnect, etc.).

In addition, the FPGAs include hardened circuitry or subsystems. One or more circuits (or blocks) may be implemented using the hardened circuitry (hardened circuitry resources, such as processors, memory, controllers, peripherals, etc.). The FPGAs also interface circuitry that provides a mechanism for interfacing one or more circuits implemented in the hardened circuitry with one or more circuits implemented in the FPGA fabric.

As described below in detail, apparatus and techniques according to exemplary embodiments provide programmable ready/valid latency features at the interface between hardened circuitry (e.g., hardened logic) and the FPGA fabric (e.g., programmable logic). During the CAD flow (typically used to program an FPGA by a user), ready/valid latencies are adjusted to meet the timing and area closure specifications, thus allowing timing closure at relatively high frequencies, or using less area, or both. The ready/valid latencies may be configured or adjusted or generated according to input from the user, or may be generated automatically (optionally, a maximum value for the ready-latency value may be obtained from the user to provide a bound on the ready-latency value).

Figure 1:
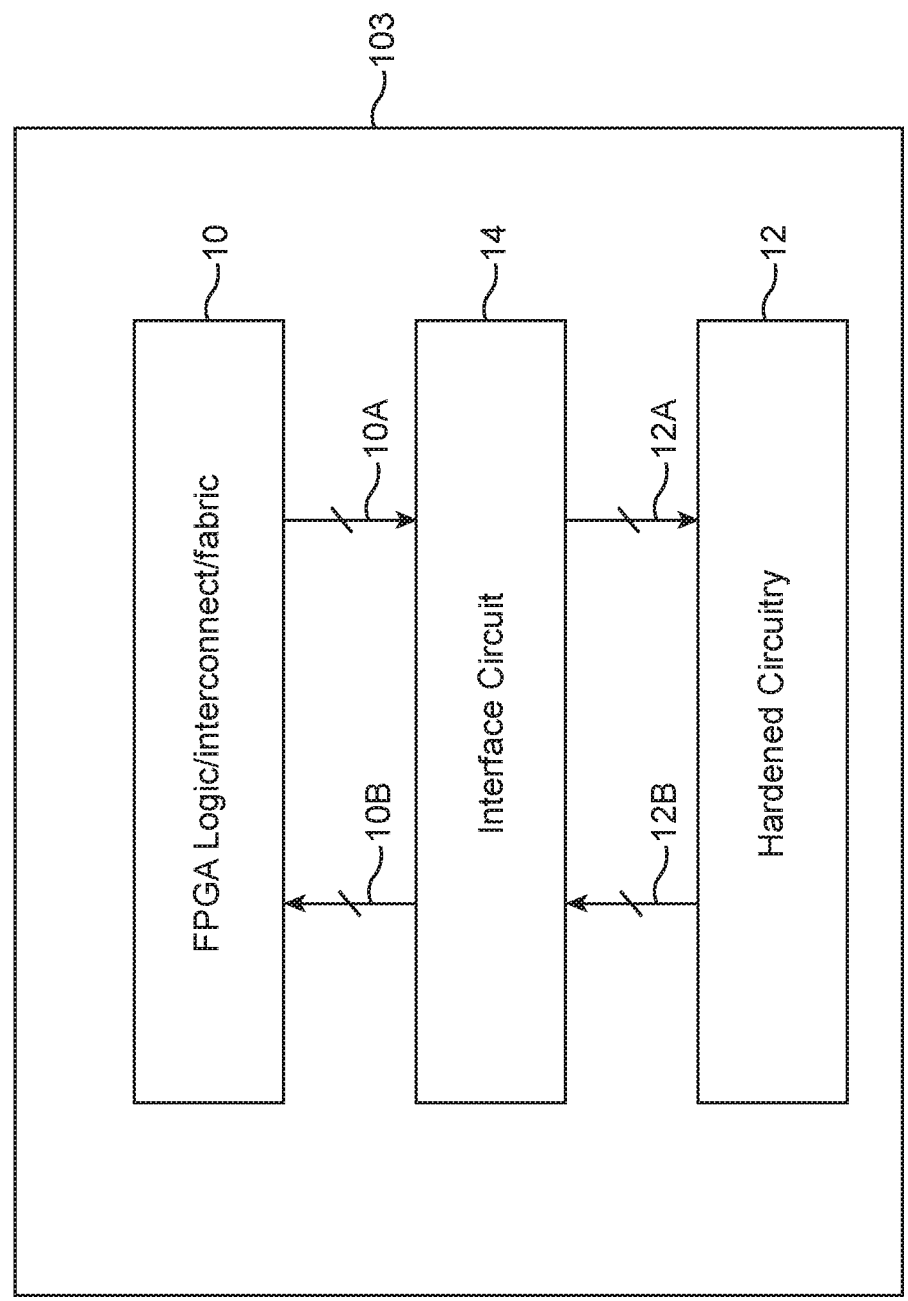
FIG. 1 shows a block diagram of an FPGA including an interface circuit according to an exemplary embodiment.

FIG. 1 shows a block diagram of an FPGA 103 according to an exemplary embodiment that includes programmable logic (part of the FPGA fabric) and hardened circuitry. FPGA 103 includes FPGA logic circuitry, interconnect circuitry, or generally FPGA fabric 10. In addition, FPGA 103 includes hardened circuitry 12. Hardened circuitry 12 may include a variety of circuits, blocks of circuitry, and/or subsystems, as persons of ordinary skill in the art understand. Examples include processors, communication circuits, memory, memory controllers, and peripherals, as described below in more detail.

Interface circuit 14 provides a flexible mechanism for FPGA fabric 10 to communicate with hardened circuitry 12.

In exemplary embodiments, FPGA fabric 10 and hardened circuitry 12 may operate in different clock domains or use different clock or operating frequencies. Interface circuit provides a mechanism for communication of data or information from FPGA fabric 10 to hardened circuitry 12, from hardened circuitry 12 to FPGA fabric 10, or between FPGA fabric 10 and hardened circuitry 12 (bi-directional communication), as desired or specified for a given application or implementation.

More specifically, through link 10A FPGA fabric 10 may provide data or information to interface circuit 14. Through link 12A interface circuit 14 may provide data or information received from FPGA fabric 10 (or data or information derived from data or information from FPGA fabric 10) to hardened circuitry 12. Likewise, through link 12B, hardened circuitry 12 may provide data or information to interface circuit 14. Through link 10B interface circuit 14 may provide data or information received from hardened circuitry 12 (or data or information derived from data or information from hardened circuitry 12) to FPGA fabric 10.

In some embodiments, communication via interface circuit 14 may provide one-way (in one direction) communication between FPGA fabric 10 and hardened circuitry 12, as desired. For example, in some embodiments, interface circuit 14 may provide a communication path from FPGA fabric 10 to hardened circuitry 12 via links 10A and 12A. As another example, in some embodiments, interface circuit 14 may provide a communication path from hardened circuitry 12 to FPGA fabric 10 via links 12B and 10B.

As note above, interface circuit 14 facilitates communication or interfacing between FPGA fabric 10 and hardened circuitry 12. Interface circuit 14 may constitute one or more ports, such as bus port(s). In some embodiments, interface circuit 14 may be an Avalon ST port, thus following the Avalon ST protocol.

In exemplary embodiments, interface circuit 14 may provide a wide range of use-models and protocols to support the behaviors desired or specified by the user's logic or configuration in FPGA fabric 10 when coupling to various circuits or blocks or subsystems in hardened circuitry 12. Examples of interface protocols between FPGA fabric 10 and hardened circuitry 12 include AMBA AXI, Avalon MM, Avalon ST, User Proprietary Protocol, and OCP. Those protocols are known to persons of ordinary skill in the art.

In exemplary embodiments, other interface protocols may be used. Furthermore, many variations in use models may be implemented, for example, variations in the number of ports, number of masters, number of slaves, and/or data widths of ports. In exemplary embodiments, a flexible interface and a technique for composing or configuring or designing interfaces that meet a wide range of user specifications using a set of low-level units of interface circuitry made available at the boundary between hardened circuitry 12 and FPGA fabric 10 are provided. Thus, low level interface units (within interface circuit 14) may be used to map efficiently into standard protocols, user protocols, and variable use models, i.e., a configurable or composable interface.

Figure 2:
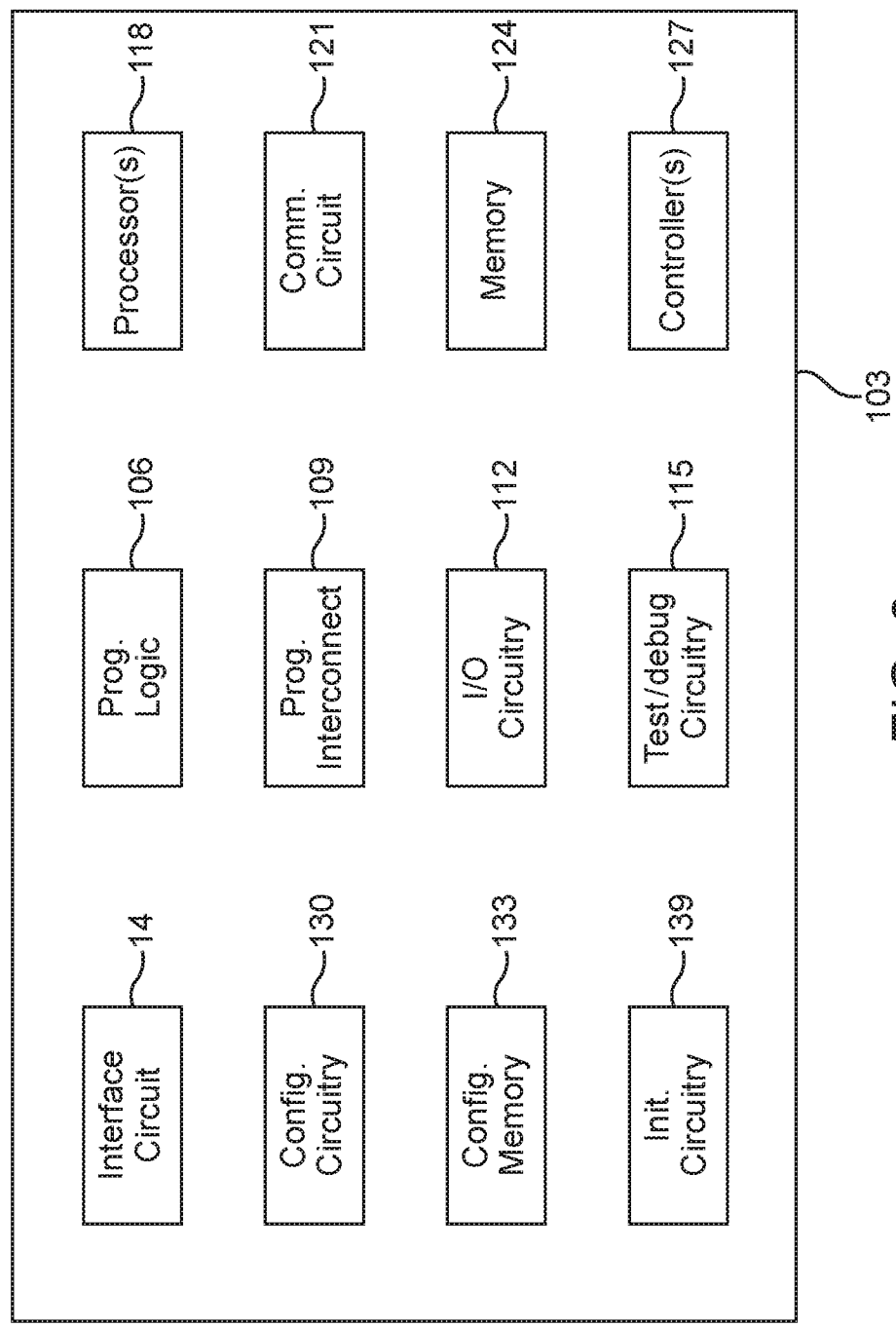
FIG. 2 depicts a block diagram of an FPGA according to an exemplary embodiment.

As noted, a variety of circuits, blocks, and/or subsystems may reside in hardened circuitry 12 within an FPGA. FIG. 2 shows a block diagram of an FPGA 103 according to an exemplary embodiment. FPGA 103 includes configuration circuitry 130, configuration memory (CRAM) 133, interface circuit 14, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuit 139, as desired.

FPGA 103 may include other blocks and circuitry, as persons of ordinary skill in the art understand. Examples of such circuitry include clock generation and distribution circuits, and the like. Furthermore, FPGA 103 may include, analog circuitry, other digital circuitry, and/or mixed-signal circuitry, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103 (for example, by using pass gates and/or MUXs).

Initialization circuit 139 may cause the performance of various functions at reset or power-up of FPGA 103. I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices. Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuits 121. Communication circuit(s) 121 may facilitate data and information exchange between various circuits within FPGA 103 and circuits external to FPGA 103, as persons of ordinary skill in the art understand. Examples of communication circuit 121 include transceivers, network interface circuits, etc. FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired. Memory controller 127 allows interfacing to, and controlling the operation and various functions of circuitry outside the FPGA. For example, memory controller 127 may interface to and control an external synchronous dynamic random access memory (SDRAM).

The fabric or core of FPGA 103 may take a variety of forms. In some embodiments, the FPGA fabric 10 may include, among other circuitry, programmable logic 106 and programmable interconnect 109. The programmable logic 106 and programmable interconnect 109 often reside within the FPGA in an array or regular structure, for example, a two-dimensional array. Thus, in some embodiments, the fabric or core of FPGA 103 may be arranged in rows and columns.

FPGA fabric 10 (see FIG. 1) may include one or more of the blocks shown in FPGA 103 in FIG. 2 (or other blocks not shown, as persons of ordinary skill in the art understand), and may take a variety of forms. Examples of such blocks include soft or programmable processor(s) 118, communication circuit(s) 121, memory 124, and/or controller(s) 127. The choice, number, and configuration of circuitry included in hardened circuitry depends on a number of factors, for example, the end-use, the user's specifications, system implementation considerations, etc., as persons of ordinary skill in the art understand.

Similarly, hardened circuitry 12 may include one or more of the blocks shown in FPGA 103 in FIG. 2 (or other blocks not shown, as persons of ordinary skill in the art understand), and may take a variety of forms. Examples of such blocks include hardened processor(s) 118, communication circuit(s) 121, memory 124, and/or controller(s) 127. The choice, number, and configuration of circuitry included in hardened circuitry depends on a number of factors, for example, the end-use, the user's specifications, system implementation considerations, etc., as persons of ordinary skill in the art understand.

As noted, synchronous protocol-based interfaces may be used in exemplary embodiments between FPGA fabric 10 and hardened circuitry 12. Closing timing on the interfaces typically includes a number of trade-offs, such as among (a) maximum frequency of operation, (b) logic circuit utilization, (c) latency, and (d) data bandwidth. Typically, one does not know a priori what the desirable or preferred or optimum trade-off is until the user's circuit is implemented using the FPGA's resources.

Furthermore, users typically specify a specific or minimum frequency of operation for their designs (or parts of their designs). Interface circuits and related techniques according to exemplary embodiments provide ways to address the various trade-offs and user specifications.

In exemplary embodiments, interface circuit 14 (see FIG. 1) operates in accordance with a protocol that uses a ready/valid (or ready-valid) signaling mechanism or protocol. The ready/valid signaling mechanism uses a ready signal and a valid signal.

The ready signal indicates that a receiver (or sink) of the data (or generally information) (e.g., FPGA fabric 10 in FIG. 1) is ready to accept or receive data. On interfaces supporting backpressure, ready is asserted by the sink to mark ready cycles, i.e., cycles where data transfer may take place. Associated with the use of the ready signal is a ready-latency parameter, so that if ready is asserted on cycle N, cycle (N+ready-latency) is considered a ready cycle.

The valid signal indicates that the sender or source has the data available to provide to the receiver on the next clock cycle. The valid signal qualifies valid data on any cycle where data are being transferred from the sender to the receiver. Such active cycles are sometimes called beats. On active cycles, the data signal and other sender-to-receiver signals are typically sampled by the receiver.

The data signal(s) typically carries the bulk of the information being transferred from the sender to the receiver. The data may include one or more symbols that are transferred from the sender to the receiver, e.g., on every active clock cycle.

As part of the ready/valid signaling mechanism, the receiver de-asserts the ready signal if it cannot accept the data on the next clock cycle. The sender of the data examines the state of the ready signal to determine whether the receiver is ready to accept data. If not, the sender refrains from sending the data, and holds the data.

The ready/valid signaling mechanism can create a timing burden on interface circuit 14. Furthermore, the ready/valid signaling mechanism may be dependent on clock skew (e.g., between the sender and receiver), and the delay back to the sender associated with the ready signal. Competing functions near the interface between FPGA fabric 10 and hardened circuitry 12 may also cause routing (e.g., to route signals between FPGA fabric 10 and hardened circuitry 12) congestion near the interface, as programmable logic in FPGA fabric 10 often has much less density than does hardened circuitry 12. Interface circuits and related techniques according to exemplary embodiments have the advantage of providing a configurable interface, despite the challenges mentioned above, to provide timing closure during CAD flow.

Figure 3:
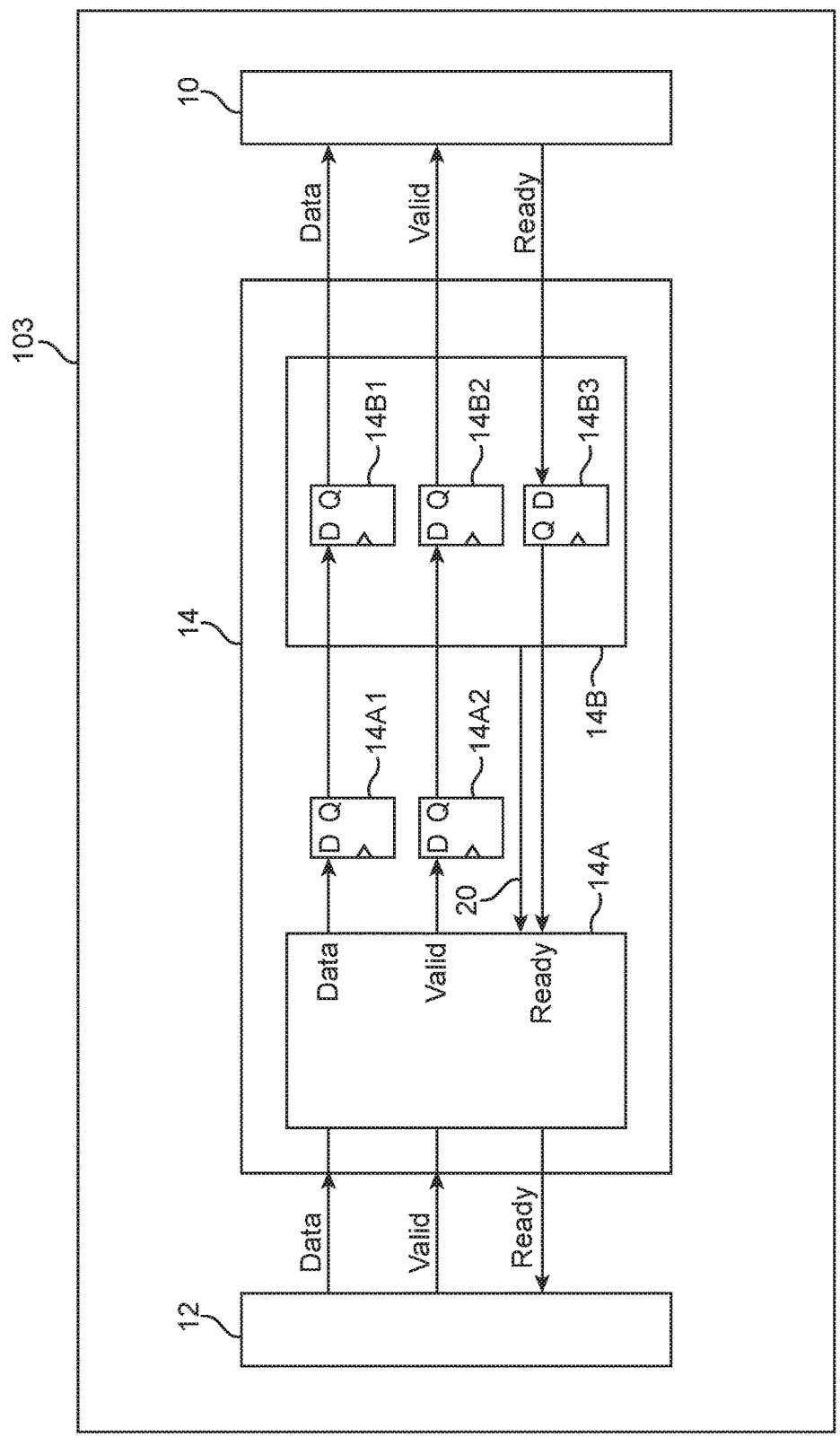
FIG. 3 illustrates an interface circuit in an FPGA 103 according to an exemplary embodiment.

Interface circuits according to exemplary embodiments provide a flexible mechanism that adheres to the ready/valid signaling mechanism. FIG. 3 illustrates an interface circuit in an FPGA 103 according to an exemplary embodiment.

More specifically, FIG. 3 provides more details of a ready/valid signaling mechanism according to an exemplary embodiment. Interface circuit 14 includes a hardened interface circuit 14A, and a soft interface circuit 14B. In other words, in the embodiment shown, interface circuit 14A is implemented using hardened circuitry or resources of FPGA 103. Conversely, interface circuit 14B is implemented using soft or programmable circuitry or resources of FPGA 103.

Note that one may partition the various blocks of interface circuit in other manners than FIG. 3 shows. In other words, FIG. 3 illustrates a logical or signal flow diagram for interface circuit 14, and not necessary a physical implementation.

Referring to FIG. 3, interface circuit 14A couples to hardened circuitry 12 via a set of data, valid, and ready lines. The data, valid, and ready lines implement a ready/valid signaling mechanism between interface circuit 14A and hardened circuitry 12. Storage elements (e.g., flip flops or latches) 14A1 and 14A2 synchronize the data and valid signals to the clock domain of interface circuit 14A or hardened circuitry 12.

As noted above, FIG. 3 illustrates a logical or signal flow diagram for interface circuit 14, and not necessary a physical implementation. Thus, in some embodiments, storage elements 14A1 and 14A2 may be shown or denoted or implemented as part of interface circuit 14A, etc.

Interface circuit 14A provides part of a mechanism for configurable or programmable ready-latency in interface circuit 14. Interface circuit 14B provides the desired ready-latency value to interface circuit 14A using signal line 20. In response, interface circuit 14A provides communication with the desired value of ready-latency, such as 0, 1, 2, etc. Note that, depending on factors such as specifications for a particular design or application, other values of ready-latency may be used, or a subset or superset of the values discussed above may be used, as desired.

Interface circuit 14A includes sequential logic circuitry to provide or implement the desired ready-latency value. In exemplary embodiments, interface circuit 14A may include buffers to "absorb" or temporarily store data to accommodate the desired ready-latency values. In other words, interface circuit 14B, operating together with other circuitry in interface circuit 14, provides communication between hardened circuitry 12 and FPGA fabric 10 using desired ready-latency values for each end of the communication path (e.g., a ready-latency value of 0 for hardened circuitry 12, and a ready-latency value of 2 for FPGA fabric 10).

Interface circuit 14A may be implemented in a variety of ways. For example, in some embodiments, interface circuit 14A may be implemented by using flip flops, latches, registers, gates, etc. As another example, in some embodiments, interface circuit 14A may be implemented by using a finite-state machine (FSM). The choice of implementation depends on factors such as available technology or resources, specifications for a particular design or application, etc.

Interface circuit 14B accepts the data and valid signals from interface circuit 14A (storage elements 14A1 and 14A2) via storage elements (e.g., flip flops or latches) 14B1 and 14B2, respectively. Storage elements 14B1-14B2 synchronize the data and valid signals to the clock domain of interface circuit 14B or FPGA fabric 10. Interface circuit 14B provides data and valid signals from storage elements 14B1 and 14B2 to FPGA fabric 10.

Furthermore, interface circuit 14B accepts a ready signal from FPGA fabric provides a corresponding ready signal to interface circuit 14A. Storage element 14B3 synchronizes the ready signal to the clock domain of interface circuit 14B or FPGA fabric 10. Thus, interface circuit 14B communicates with circuitry in FPGA fabric 10 using desired or configured or programmed ready-latency values (e.g., 0, 1, 2, 3, etc.).

As noted above, interface circuit 14A provides configurable or programmable ready-latency values. In some embodiments, the ready-latency values may be programmed statically, e.g., by values stored in configuration memory 133 (see FIG. 2). Thus, such values of ready-latency are used from the time of programming or configuration of FPGA 103 until re-configuration or re-programming of FPGA 103. In some embodiments, the ready-latency values may be programmed dynamically, e.g., by providing desired ready-latency values while the FPGA is implementing a user's circuit or function.

By virtue of using interface circuit 14, FPGA 103 can reach timing closure even though hardened circuitry 12 and FPGA fabric 10 may have inconsistent or conflicting timing specifications. As an example includes the situation where hardened circuitry 12 is specified to use a ready-latency value of 0, whereas FPGA fabric 10 is specified to use a ready-latency value of greater than 0. Put another way, using interface circuit 14 "hides" the timing conflict from FPGA fabric 10, while communicating with hardened circuitry 12 with the desired ready-latency value of 0.

Note that FIG. 3 shows an interface circuit for sending or communicating data or information from hardened circuitry 12 to FPGA fabric 10. To send or communicate data or information from FPGA fabric 10 to hardened circuitry 12, one may reverse the order of the signal flow and of the blocks/circuits in FIG. 3 (e.g., a mirror image). Alternatively, one may use both the circuit shown in FIG. 3 and a reversed circuit/signal flow (e.g., a mirror image) to provide communication from hardened circuitry 12 to FPGA fabric 10, as well as communication from FPGA fabric 10 to hardened circuitry 12 (i.e., duplex or bidirectional communication for data transfer).

Figure 4:
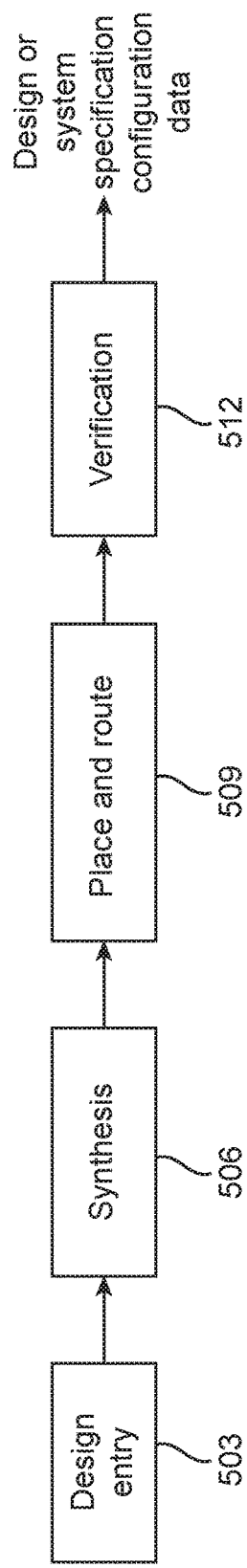
FIG. 4 shows an FPGA computer aided design (CAD) flow according to an exemplary embodiment.

Interfaces with programmable or configurable ready-latency may be implemented or made available in FPGAs in a number of ways, using an FPGA CAD flow. FIG. 4 illustrates an FPGA CAD flow according to an exemplary embodiment. The CAD flow includes design-entry module 503, synthesis module 506, place-and-route module 509, and verification module 512.

Design-entry module 503 allows the editing of various design description files using graphical or textual descriptions of a circuit or its behavior, such as schematics, hardware description languages (HDL), RTL, or waveforms, as desired. The user may generate the design files by using design-entry module 503 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Regardless of the method of entry, in exemplary embodiments, the user specifies parameters relating to ready/valid signaling in desired parts of FPGA 103. For example, the user may enter a desired operating frequency for one or more interfaces (see FIG. 1). Referring to FIG. 4, the user may provide or set a desired or maximum value for the ready-latency for one or more interfaces that use ready/valid signaling. Design-entry module generates the specifications for FPGA 103, using the specifications that the user provides.

Synthesis module 506 accepts the output of design-entry module 503. Based on the user-provided design, synthesis module 506 generates appropriate logic circuitry that realizes the user-provided design. An FPGA (not shown explicitly), such as FPGA 103 in FIGS. 1-3, implements the synthesized overall design or system. Synthesis module 506 may also generate any glue logic that allows integration and proper operation and interfacing of various modules in the user's designs. For example, synthesis module 506 provides appropriate hardware so that an output of one block properly interfaces with an input of another block.

Synthesis module 506 may provide appropriate hardware so as to meet the specifications of each of the modules in the overall design or system. Furthermore, synthesis module 506 may include algorithms and routines for optimizing the synthesized design. Through optimization, synthesis module 506 seeks to more efficiently use the resources of the FPGA that implements the overall design or system. Synthesis module 506 also provides appropriate resources or circuitry for various desired functions in FPGA 103, such as one or more interface circuits 14 (see FIGS. 1-3). Synthesis module 506 may annotate or flagging appropriate elements or blocks in the design to indicate whether a ready-latency value of 0 is used, or whether ready-latency values of greater than 0 are used (i.e., whether multi-cycle paths are used to communicate data from sender(s) to receiver(s)).

In the exemplary embodiment shown in FIG. 4, synthesis module 506 provides its output to place-and-route module 509. A number of modifications to the CAD flow of FIG. 4 are possible. For example, in some embodiments, following synthesis, one may include a technology mapping module (not shown in FIG. 4), as desired.

Place-and-route module 509 uses the designer's specifications, for example, timing specifications to perform optimal logic mapping and placement. The logic mapping and placement determine the use of logic resources within FPGA 103. Among other things, place-and-route module 509 uses particular resources, such as FPGA fabric (e.g., programmable logic 106, programmable interconnect 109, etc.) and hardened circuitry 12 for implementing desired interface circuit(s) 14. Place-and-route module 509 may also determine the use of various resources in FPGA 103 to improve or optimize the performance of the overall design or system. By the proper use of FPGA resources, place-and-route module 509 helps to meet the critical or desired or specified timing paths of the overall design or system. Place-and-route module 509 may also optimize or improve such timing paths to help provide timing closure faster. As a result, the overall design or system can achieve faster performance (i.e., operate at a higher clock frequency or have higher throughput).

Verification module 512 performs simulation and verification of the design. The simulation and verification seek in part to verify that the design complies with the user's prescribed specifications. The simulation and verification also aim at detecting and correcting any design problems before prototyping the design. Thus, verification module 512 helps the user to reduce the overall cost and time-to-market of the overall design or system. Verification module 512 may support and perform a variety of verification and simulation options, as desired. The options may include functional verification, test-bench generation, timing analysis, timing simulation, hardware/software simulation, in-system verification, board-level timing analysis, signal integrity analysis and electro-magnetic compatibility (EMC), formal netlist verification, area (resource use), and the like. A check is made whether the design meets the specified parameters (e.g., clock frequency, ready-latency values) for interfaces that use ready/valid signaling. Note that one may perform other or additional verification techniques as desired. Furthermore, verification of the design may also be performed at other phases in the flow, as appropriate, and as desired.

Note that FIG. 4 illustrates merely one possible CAD flow that may be used to implement a user's design that includes one or more interfaces that use ready/valid signaling with configurable or programmable ready-latency. As persons of ordinary skill in the art understand, other CAD flows may be used or modified appropriately to include the disclosed concepts for implementing such interfaces.

Regardless of the specific CAD flow used, the CAD software may use a variety of techniques to implement the user's circuit with one or more interfaces that use ready/valid signaling with configurable or programmable ready-latency. The CAD flow therefore automatically determines and uses the ready-latency value (if one exists) that meets various criteria set by the user (e.g., desired operating frequency of interfaces, timing specifications, maximum ready-latency values, etc.).

Figure 5:
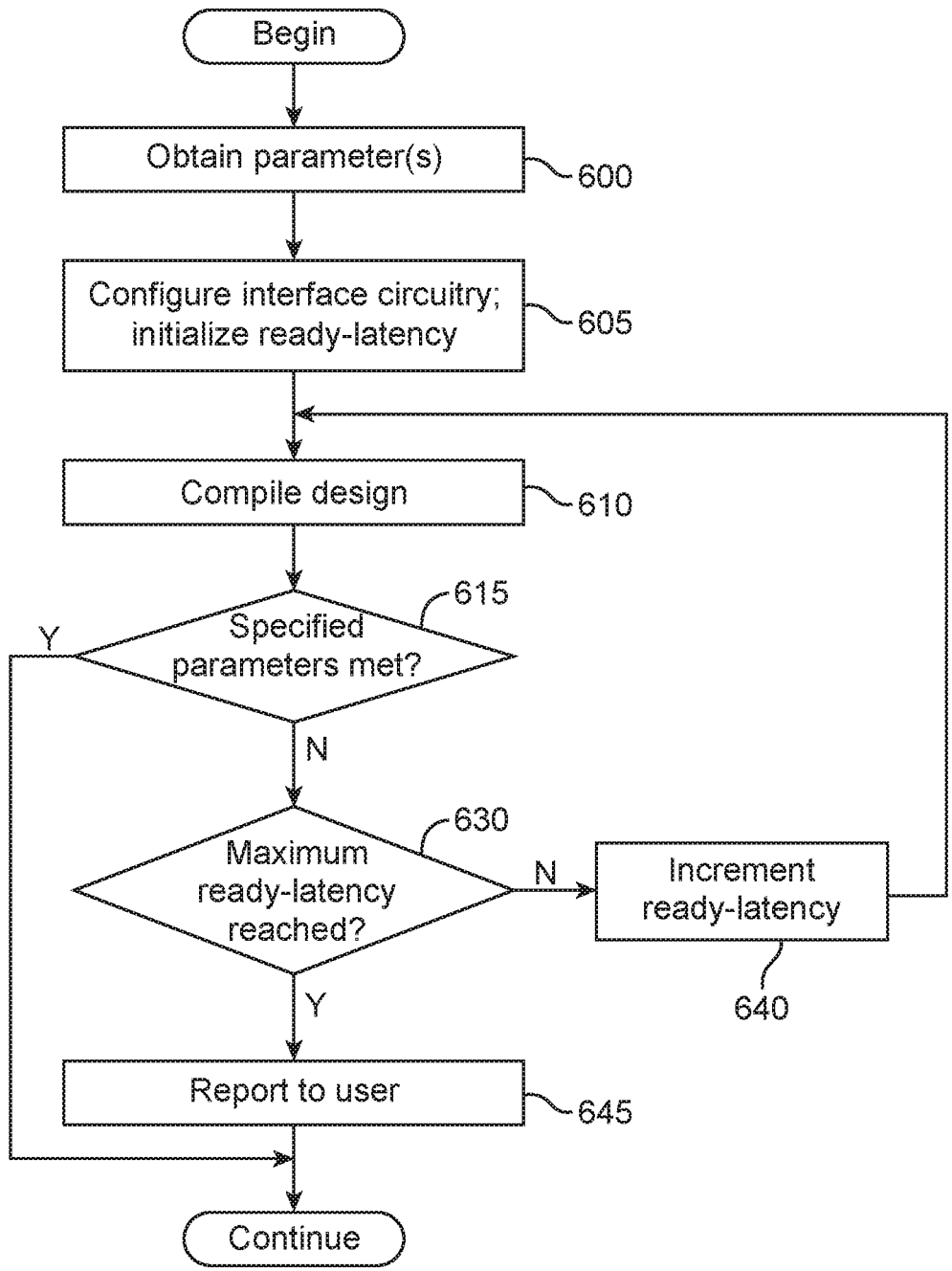
FIG. 5 depicts a flow diagram for a method of implementing interfaces with ready/valid signaling according to an exemplary embodiment.

As an example, FIG. 5 depicts a flow diagram for a method of implementing such an interface according to an exemplary embodiment. At 600, various parameters are obtained from the user. The parameters may include, for example, information about one or more interfaces that use ready/valid signaling, such as desired operating frequency, maximum or desired ready-latency values, etc. At 605, various circuits in the FPGA are configured. For example, one or more interface circuits 14 (see FIGS. 1-3) are inserted or implemented. The ready-latency value is also initialized, for example, to zero.

At 610, the design is compiled, using the CAD flow steps described above, attempting to arrive at a circuit that meets the desired parameters or specifications. At 615, a check is made to determine whether the design meets the desired parameters or specifications. If so, the results may be optionally reported to the user, and processing continues with other tasks (not shown in FIG. 5).

If not, a check is made at 630 to determine whether the current value of ready-latency equals the maximum or desired ready-latency value. If so, at 645 the results are optionally reported to the user. Also, in some embodiments, the user may be given an opportunity to change parameters to try again.

Referring to the check at 630, if the current value of ready-latency is less than the maximum or desired ready-latency, the value of ready-latency is incremented at 640. The process then returns to 610 to compile the design with the new (incremented) ready-latency.

Figure 6:
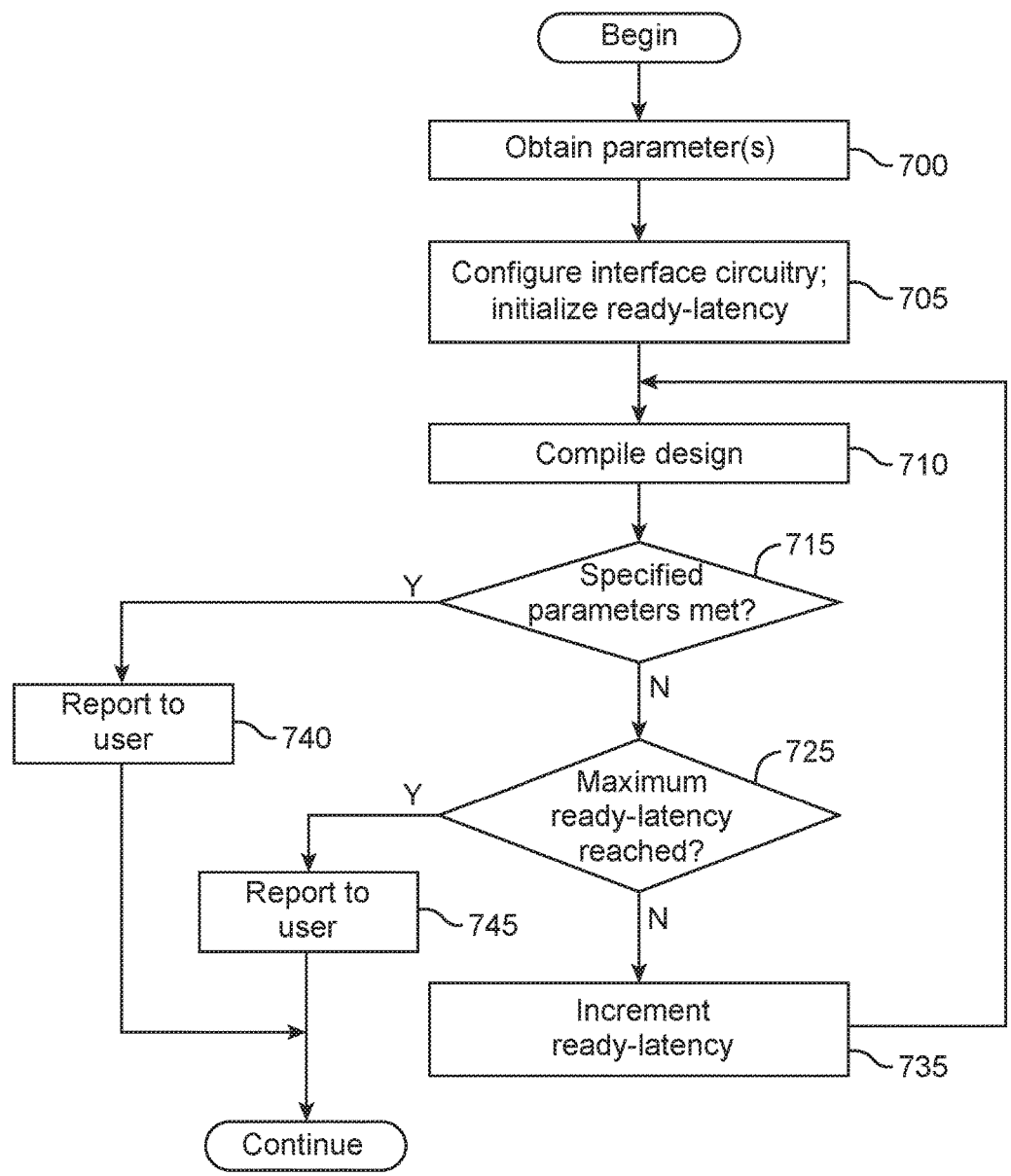
FIG. 6 illustrates a flow diagram for a method of implementing interfaces with ready/valid signaling according to another exemplary embodiment.

FIG. 6 depicts a flow diagram for a method of implementing interfaces with ready/valid signaling according to another exemplary embodiment. In the exemplary embodiment shown, the CAD flow attempts to determine a ready-latency value that meets various specified parameters or conditions.

At 700, various parameters are obtained from the user. Similar to the scenario described above, the parameters may include, for example, information about one or more interfaces that use ready/valid signaling, such as desired operating frequency, maximum or desired ready-latency values, etc. At 705, various circuits in the FPGA are configured. For example, one or more interface circuits 14 (see FIGS. 1-3) are inserted or implemented. The ready-latency value is also initialized, for example, to zero.

At 710, the design is compiled, using the CAD flow steps described above, attempting to arrive at a circuit that meets the desired parameters or specifications. At 715, a check is made to determine whether the design meets the desired parameters or specifications. If so, at 740, the results may be optionally reported to the user. Approval for the determined parameters, such as the ready-latency value(s) may be obtained from the user, as desired. In either case, processing may continue with other tasks (not shown in FIG. 6).

Referring to the check at 715, if the design does not meet the desired parameters or specifications, specifically ready-latency, a check is made at 725 to determine whether the current value of ready-latency equals the maximum or desired ready-latency value. If so, at 745 the results are optionally reported to the user. Also, in some embodiments, the user may be given an opportunity to change parameters to try again, in which case control would return to 700 to obtain new parameters.

Referring to the check at 725, if the current value of ready-latency is less than the maximum or desired ready-latency value, the value of ready-latency is incremented at 735. The process then returns to 710 to compile the design with the new (incremented) ready-latency.

Figure 7:
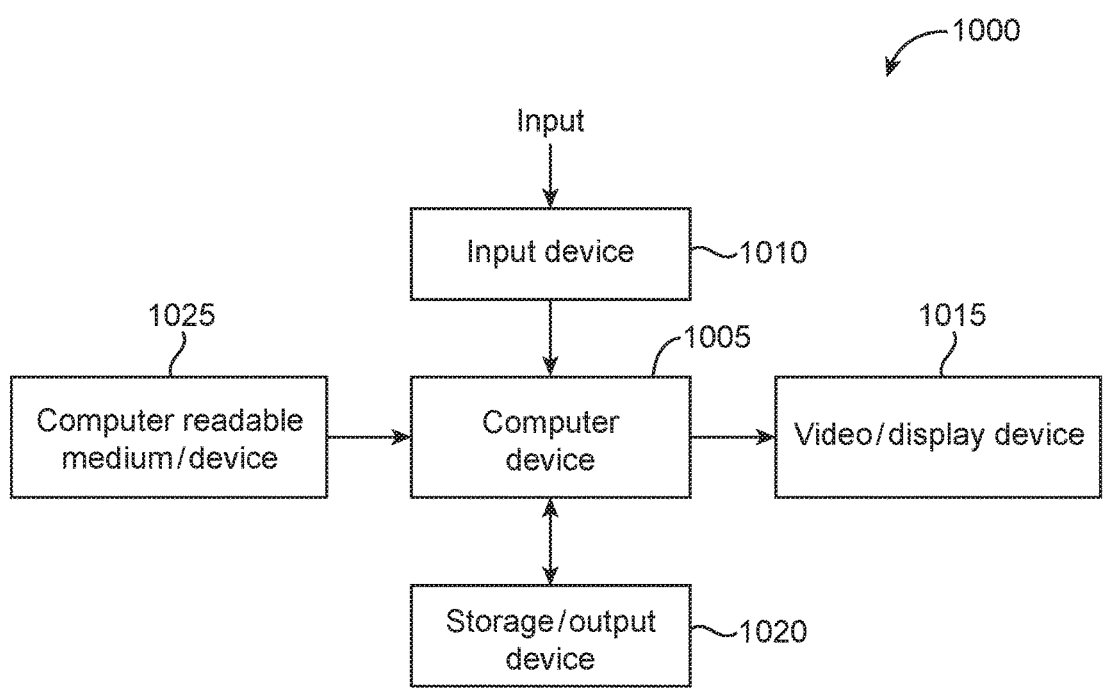
FIG. 7 shows a block diagram of an exemplary system for information processing according to exemplary embodiments.

According to one aspect of the disclosed concepts, one may perform, run, or execute the disclosed algorithms, methods, flows, or software, such as the CAD flow described above, on computer systems, devices, processors, controllers, etc. FIG. 7 shows a block diagram of an exemplary system 1000 for processing information according an exemplary embodiment. System 1000 includes a computer device 1005, an input device 1010, a video/display device 1015, and a storage/output device 1020, although one may include more than one of each of those devices, as desired.

Computer device 1005 couples to input device 1010, video/display device 1015, and storage/output device 1020. System 1000 may include more than one computer device 1005, for example, a set of associated computer devices or systems, as desired.

Typically, system 1000 operates in association with input from a user. The user input typically causes system 1000 to perform information-processing tasks, such as the disclosed information-processing tasks, including CAD flow or software, etc. System 1000 in part uses computer device 1005 to perform those tasks. Computer device 1005 includes information-processing circuitry, such as a central-processing unit (CPU), controller, microcontroller, etc., although one may use more than one such device or information-processing circuitry, as persons skilled in the art would understand.

Input device 1010 receives input from the user and makes that input available to computer device 1005 for processing. The user input may include data, instructions, and/or graphics (e.g., hard-writing), as desired. Input device 1010 may constitute an alphanumeric input device (e.g., a keyboard, whether physical or simulated), a pointing (or touch) device (e.g., a mouse, roller-ball, light pen, stylus, touch-sensitive apparatus, for example, a touch-sensitive pad, display, or tablet), and/or other input mechanism, as desired. The user operates the alphanumeric keyboard to provide text, such as ASCII characters, to computer device 1005. Similarly, the user operates the pointing (or touch) device to provide cursor position or control information to computer device 1005.

Video/display device 1015 displays visual images to the user. Video/display device 1015 may include graphics circuitry, such as graphics processors, as desired. The visual images may include information about the operation of computer device 1005, such as graphs, pictures, images, videos, and text. Video/display device 1015 may include a computer monitor or display, a projection device, or generally any device for displaying various objects, as persons of ordinary skill in the art would understand. If system 1000 uses a touch-sensitive display, the display may also operate to provide user input to computer device 1005.

Storage/output device 1020 allows computer device 1005 to store information for additional processing or later retrieval (e.g., softcopy), to present information in various forms (e.g., hardcopy), or both. As an example, storage/output device 1020 may include a magnetic, optical, semiconductor (e.g., volatile or non-volatile devices or circuits, such as a flash memory or drive), or magneto-optical drive capable of storing information on a desired medium and in a desired format. As another example, storage/output device 1020 may constitute a printer, plotter, or other output device to generate printed or plotted expressions of the information from computer device 1005.

Computer-readable medium 1025 interrelates structurally and functionally to computer device 1005. Computer-readable medium 1025 stores, encodes, records, and/or embodies functional descriptive material. By way of illustration, the functional descriptive material may include computer programs, computer code, computer applications, and/or information structures (e.g., data structures or file systems). In some embodiments, computer-readable medium 1025 may be transitory. In some embodiments, computer-readable medium 1025 may be non-transitory. As examples, computer-readable medium 1025 may include a magnetic, optical, semiconductor, or magneto-optical medium capable of storing information in a desired format.

When stored, encoded, recorded, and/or embodied by computer-readable medium 1025, the functional descriptive material imparts functionality. The functional descriptive material interrelates to computer-readable medium 1025.

Information structures within the functional descriptive material define structural and functional interrelations between the information structures and computer-readable medium 1025 and/or other aspects of system 1000. These interrelations permit the realization of the information structures' functionality.

Moreover, within such functional descriptive material, computer programs define structural and functional interrelations between the computer programs and computer-readable medium 1025 and other aspects of system 1000. These interrelations permit the realization of the computer programs' functionality. Thus, in a general sense, computer-readable medium 1025 includes information, such as instructions, that when executed by computer device 1005, cause computer device 1005 (system 1000, generally) to provide the functionality prescribed by a computer program, software, method, algorithm, etc., as included (partially or entirely) in computer-readable medium 1025.

As persons of ordinary skill in the art understand, one may apply the disclosed concepts effectively to various types of electronic circuits. Examples described in this document (FPGAs) constitute merely illustrative applications, and are not intended to limit the application of the disclosed concepts to other ICs, which falls within the level of skill of persons of ordinary skill in the art. Examples of such ICs include programmable logic devices (PLDs), complex PLDs (CPLDs), structured application specific ICs (ASICs), and the like.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An integrated circuit (IC), comprising:
   a first circuit implemented using programmable circuitry of the IC;
   a second circuit implemented using hardened circuitry of the IC; and
   a configurable interface circuit to couple the first circuit to the second circuit using ready/valid signaling with a configurable ready-latency value.

2. The IC according to claim 1, wherein the configurable interface circuit comprises a first interface circuit implemented using programmable circuitry of the IC;
   and a second interface circuit implemented using hardened circuitry of the IC.

3. The IC according to claim 1, wherein the first circuit comprises programmable logic, programmable interconnect, or both.

4. The IC according to claim 1, wherein the second circuit comprises a processor, a memory, a controller, or a peripheral.

5. The IC according to claim 1, wherein the ready-latency value is configured to meet a desired clock frequency of the ready/valid signaling.

6. The IC according to claim 1, wherein the first circuit operates according to a first protocol.

7. The IC according to claim 6, wherein the second circuit operates according to a second protocol.

8. The IC according to claim 1, wherein the ready-latency value is configured to meet at least a part of timing specifications for the IC.

9. A field programmable gate array (FPGA), comprising FPGA fabric and hardened circuitry integrated in the FPGA; and an interface circuit to couple the FPGA fabric to the hardened circuitry, the interface circuit having a configurable ready-latency value.

10. The FPGA according to claim 9, wherein the interface circuit communicates information from the FPGA fabric to the hardened circuitry.

11. The FPGA according to claim 9, wherein the interface circuit communicates information from the hardened circuitry to the FPGA fabric.

12. The FPGA according to claim 9, wherein the interface circuit communicates information between the FPGA fabric and the hardened circuitry according to AMBA AXI, Avalon MM, Avalon ST, User Proprietary Protocol, or OCP.

13. The FPGA according to claim 9, wherein the ready-latency value used by the interface circuit is configured to meet a specified frequency of communication between the FPGA fabric and the hardened circuitry.

14. A method of configuring a field programmable gate array (FPGA) to implement a user's circuit using resources in the FPGA, the method comprising configuring an interface circuit coupled to a first circuit implemented using FPGA fabric and to a second circuit implemented as hardened circuitry, wherein the interface circuit is adapted to provide communication between the first and second circuits using a ready/valid signaling protocol with a configurable ready-latency value.

15. The method according to claim 14, further comprising configuring the interface circuit to provide communication from the first circuit to the second circuit.

16. The method according to claim 14, further comprising configuring the interface circuit to provide communication from the second circuit to the first circuit.

17. The method according to claim 14, further comprising configuring the ready-latency value based on input from the user.

18. The method according to claim 14, further comprising configuring the ready-latency value such that the interface circuit meets a specified frequency of communication between the first and second circuits.

19. The method according to claim 14, further comprising configuring the ready-latency value so as to obtain timing closure for the FPGA.

20. The method according to claim 14, further comprising synthesizing and placing-and-routing the interface circuit with a ready-latency value that meets at least one specification of the user's design.

* * * * *